US012751024B2

(12) United States Patent
Huang et al.

(10) Patent No.: US 12,751,024 B2
(45) Date of Patent: Sep. 29, 2026

(54) HETEROJUNCTION BIPOLAR TRANSISTOR AND BASE-COLLECTOR GRADE LAYER

(71) Applicant: National Taiwan University, Taipei (TW)

(72) Inventors: Jian-Jang Huang, Taipei (TW); Yuh-Renn Wu, Taipei (TW); Zih-Hao Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 355 days.

(21) Appl. No.: 18/653,193

(22) Filed: May 2, 2024

(65) Prior Publication Data

US 2025/0031395 A1 Jan. 23, 2025

(30) Foreign Application Priority Data

Jul. 19, 2023 (TW) ................................ 112127003

(51) Int. Cl.

| | |
|---|---|
| ***H10D 62/13*** | (2025.01) |
| ***H10D 10/80*** | (2025.01) |
| ***H10D 62/17*** | (2025.01) |

(52) U.S. Cl.

CPC ........... *H10D 10/80* (2025.01); *H10D 62/136* (2025.01); *H10D 62/137* (2025.01); *H10D 62/184* (2025.01)

(58) Field of Classification Search

CPC .... H10D 10/80; H10D 62/136; H10D 62/137; H10D 62/184; H10D 62/8164; H10D 62/824; H10D 10/821

See application file for complete search history.

(56) References Cited

U.S. PATENT DOCUMENTS 5,606,185 A 2/1997 Nguyen et al.

OTHER PUBLICATIONS

K. Yang et al., "InP Double Heterojunction Bipolar Transistors with Chirped InGaAs/InP Superlattice Base-Collector Junction Grown by CBE," 1997 Proceedings IEEE/Cornell Conference on Advanced Concepts in High Speed Semiconductor Devices and Circuits, DOI: 10.1109/CORNEL.1997.649368, 1997, pp. 278-286.

*Primary Examiner* — Elias Ullah

(74) *Attorney, Agent, or Firm* — MUNCY, GEISSLER, OLDS & LOWE, P.C.

(57) ABSTRACT

A heterojunction bipolar transistor and a base-collector grade layer. The heterojunction bipolar transistor includes a substrate, a sub-collector layer, a collector layer, a base layer, a base-collector grade layer and an emitter layer. The sub-collector layer is disposed on the substrate. The collector layer is disposed over the sub-collector layer. The base layer is disposed over the collector layer. The base-collector grade layer is disposed between the base layer and the collector layer, and includes at least two stacked periodic structures. Each periodic structure includes an $In_{0.53}Ga_{0.47}As$ layer and an $Al_xGa_yIn_{1-x-y}As$ layer stacked on the $In_{0.53}Ga_{0.47}As$ layer. The range of x is 0.04~0.44, the range of y is 0.44~0.04, and the thickness of the $Al_xGa_yIn_{1-x-y}As$ layer is 0.6 nm~1.8 nm. The emitter layer is disposed on the base layer.

17 Claims, 15 Drawing Sheets

HETEROJUNCTION BIPOLAR TRANSISTOR AND BASE-COLLECTOR GRADE LAYER

CROSS REFERENCE TO RELATED APPLICATIONS

This Non-provisional application claims priority under 35 U.S.C. § 119(a) on Patent Application No(s). 112127003 filed in Taiwan, Republic of China on Jul. 19, 2023, the entire contents of which are hereby incorporated by reference.

BACKGROUND

Technology Field

The present disclosure relates to a transistor and, in particular, to a heterojunction bipolar transistor (HBT) including $InP/In_{0.53}Ga_{0.47}As$.

Description of Related Art

In recent years, due to the advancement of epitaxial technology, various heterostructure components including the lattice matching structures, superlattice structures, pseudomorphic stress layer and metamorphic structures have been invented continuously. Heterojunction bipolar transistors (HBTs) have been used in digital and microwave power applications due to their low noise, high-speed and high-current operation capabilities. In the heterojunction bipolar transistors, compared with GaAs related material systems, since the InGaAs material has the advantages of low surface recombination rate, low effective electron mass, low conductive voltage, and compatibility with long-wavelength optical components, the material system of $InP/In_{0.53}Ga_{0.47}As$ can not only achieve the functions of high speed, low power consumption and signal amplification, but also be applied to low-noise oscillator circuits and optoelectronic ICs having the wavelength range of 1.3 to 1.5 m.

However, in the HBT made of $InP/In_{0.53}Ga_{0.47}As$, the electric field in the junction region (depletion region) between the base ($In_{0.53}Ga_{0.47}As$) and the collector (InP) is relatively large, which may cause the breakdown of HBT. Therefore, it is necessary to increase the breakdown voltage (e.g. BVcbo) by increasing the effective bandgap in this region. In addition, because of the difference in the bandgap of InP and $In_{0.53}Ga_{0.47}As$, the heterojunction between the base and the collector has a discontinuity on the conduction band, which will form an electron barrier that raises the electron blocking effect and lower the cutoff frequency ($f_T$).

One of the conventional methods for lowering the electron blocking effect is to insert a chirp-superlattice layer (chirp-S.L.) in the junction region between InP and $In_{0.53}Ga_{0.47}As$. However, adjusting the In composition will result in lattice mismatch between InGaAs and InP layers. Therefore, a common approach is to vary the thicknesses of the superlattice structure, which consists of many periods of large and small bandgap layers. It is difficult to reduce the thickness of the entire base-collector graded layers.

Therefore, it is desired to provide a heterojunction bipolar transistor that can eliminate the discontinuity of conduction band between the base layer and collector layer, reduce the electron blocking effect, and decrease the thickness of the base-collector grade layer.

SUMMARY

In view of the foregoing, an objective of this disclosure is to provide a base-collector grade layer and a heterojunction bipolar transistor including the base-collector grade layer.

The base-collector grade layer and heterojunction bipolar transistor of this disclosure can eliminate the discontinuity of conduction band between the base layer and collector layer and reduce the electron blocking effect. Moreover, the base-collector grade layer of this disclosure has a thickness less than that of the conventional ones.

To achieve the above, a heterojunction bipolar transistor of this disclosure includes a substrate, a sub-collector layer, a collector layer, a base layer, a base-collector grade layer, and an emitter layer. The sub-collector layer is disposed on the substrate. The collector layer is disposed over the sub-collector layer. The base layer is disposed over the collector layer. The base-collector grade layer is disposed between the base layer and the collector layer. The emitter layer is disposed over the base layer. The base-collector grade layer includes at least two stacked periodic structures, and each of the periodic structures includes an $In_{0.53}Ga_{0.47}As$ layer and an $Al_xGa_yIn_{1-x-y}As$ layer stacked on the $In_{0.53}Ga_{0.47}As$ layer. Wherein, x ranges from 0.04 to 0.44, y ranges from 0.44 to 0.04, and the thickness of the $Al_xGa_yIn_{1-x-y}As$ layer ranges from 0.6 nm to 1.8 nm.

To achieve the above, this disclosure also provides a base-collector grade layer of a heterojunction bipolar transistor. The heterojunction bipolar transistor includes a base layer, a collector layer, and a base-collector grade layer disposed between the base layer and the collector layer. The base-collector grade layer includes at least two stacked periodic structures. Each of the periodic structures includes an $In_{0.53}Ga_{0.47}As$ layer and an $Al_xGa_yIn_{1-x-y}As$ layer stacked on the $In_{0.53}Ga_{0.47}As$ layer. Wherein, x ranges from 0.04 to 0.44, y ranges from 0.44 to 0.04, and the thickness of the $Al_xGa_yIn_{1-x-y}As$ layer ranges from 0.6 nm to 1.8 nm.

In one embodiment, the heterojunction bipolar transistor further includes an etch stop layer and a collector contact layer. The etch stop layer is disposed between the sub-collector layer and the collector layer. The collector contact layer is arranged next to the collector layer and disposed on the etch stop layer.

In one embodiment, the heterojunction bipolar transistor further includes an emitter cap layer, an emitter contact layer and a base contact layer. The emitter cap layer is disposed on the emitter layer. The emitter contact layer is disposed on the emitter cap layer. The base contact layer is arranged next to the emitter layer and disposed on the base layer.

In one embodiment, the heterojunction bipolar transistor further includes a doped buffer layer and a transition layer. The doped buffer layer is disposed between the collector layer and the base-collector grade layer. The transition layer is disposed between the base layer and the emitter layer.

In one embodiment, the base-collector grade layer includes 2 to 10 of the stacked periodic structures.

In one embodiment, $x+y=0.48$.

In one embodiment, the thicknesses of the $Al_xGa_yIn_{1-x-y}As$ layers in the stacked periodic structures are equal.

In one embodiment, the thickness of one of the $In_{0.53}Ga_{0.47}As$ layers close to the base layer is greater than the thickness of another one of the $In_{0.53}Ga_{0.47}As$ layers close to the collector layer.

In one embodiment, the base-collector grade layer includes six stacked periodic structures, and the thicknesses of the $In_{0.53}Ga_{0.47}As$ layers in the six stacked periodic structures are increasing in a direction from the collector layer to the base layer.

In one embodiment, the base-collector grade layer includes ten stacked periodic structures, and the thicknesses of some of the $In_{0.53}Ga_{0.47}As$ layers in the ten stacked periodic structures are equal.

As mentioned above, in the base-collector grade layer and heterojunction bipolar transistor of this disclosure, the base-collector grade layer is disposed between the base layer and the collector layer, and includes at least two stacked periodic structures. Each periodic structure includes an $In_{0.53}Ga_{0.47}As$ layer and an $Al_xGa_yIn_{1-x-y}As$ layer stacked on the $In_{0.53}Ga_{0.47}As$ layer, wherein x ranges from 0.04 to 0.44, y ranges from 0.44 to 0.04, and the thickness of the $Al_xGa_yIn_{1-x-y}As$ layer ranges from 0.6 nm to 1.8 nm. Based on this design, the heterojunction bipolar transistor of this disclosure can eliminate the discontinuity of conduction band between the base layer and collector layer, reduce the electron blocking effect, and increase the cutoff frequency. Moreover, compared with the conventional technology, the base-collector grade layer of this disclosure has a smaller thickness, so that the thickness of the entire heterojunction bipolar transistor also has a smaller thickness.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements. The components or layers appearing in the following embodiments are only used to illustrate the relative relationships thereof, and does not represent the proportion or dimension of the actual component or layer.

Figure 1A:
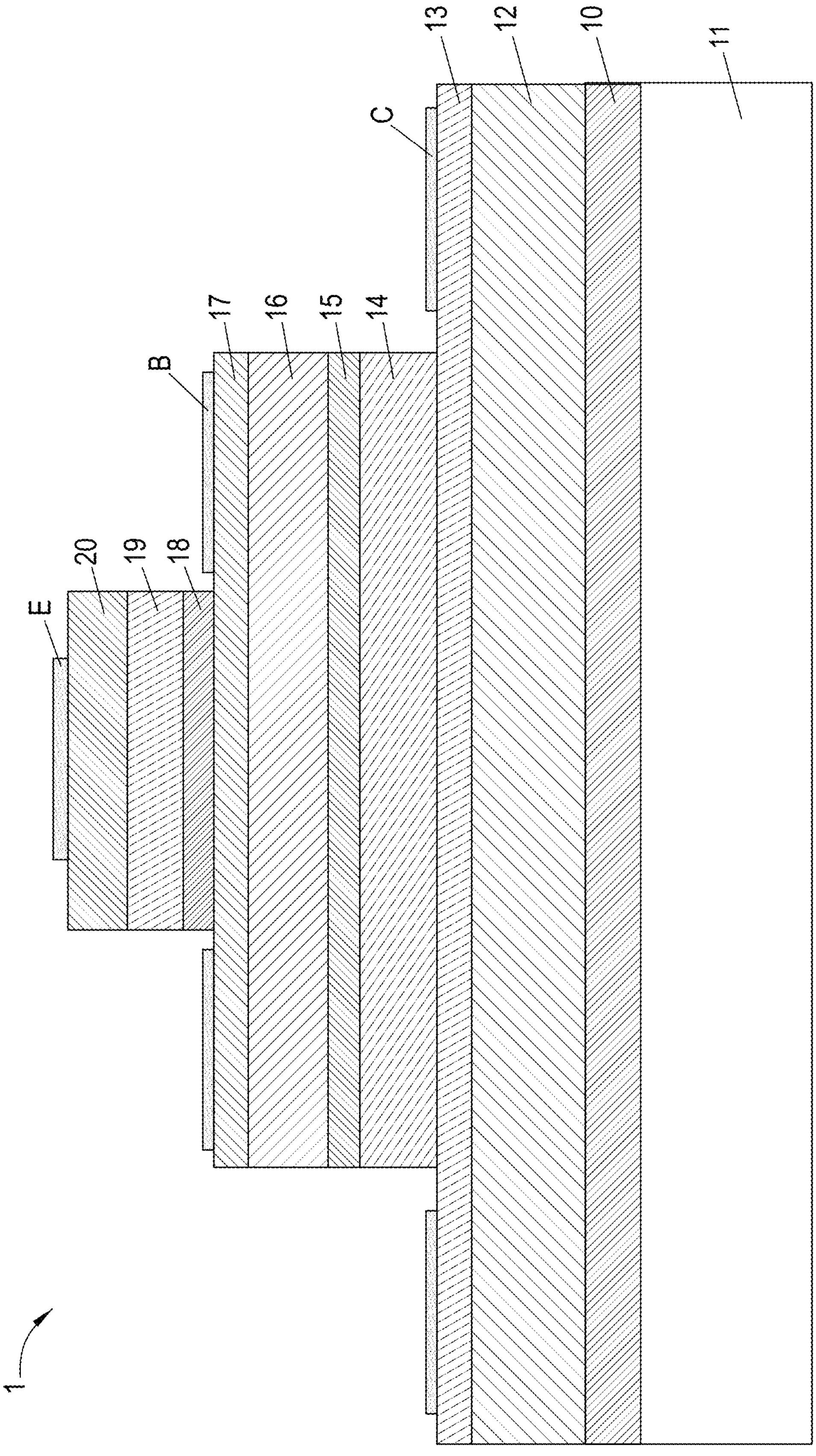
FIG. 1A is a schematic diagram showing the structure of a heterojunction bipolar transistor according to an embodiment of this disclosure.
Figure 1B:
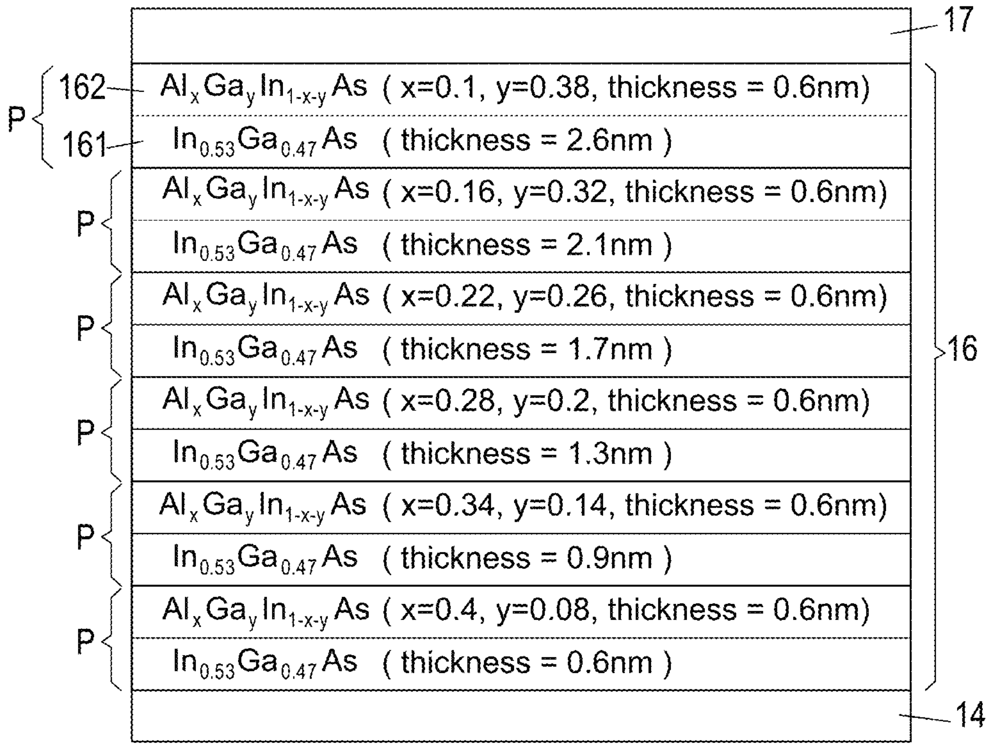
FIG. 1B is a schematic diagram showing the base layer, the base-collector grade layer and the collector layer in the heterojunction bipolar transistor of FIG. 1A.

FIG. 1A is a schematic diagram showing the structure of a heterojunction bipolar transistor according to an embodiment of this disclosure, and FIG. 1B is a schematic diagram showing the base layer, the base-collector grade layer and the collector layer in the heterojunction bipolar transistor of FIG. 1A. FIGS. 2A to 2F are schematic diagrams showing the base layers, the base-collector grade layers and the collector layers in the heterojunction bipolar transistors according to different embodiments of this disclosure. FIGS. 3A and 3B are schematic diagrams showing the structures of comparison examples I and II. To be noted, FIGS. 1B, 2A to 2F and 3A only show the base layer 17, the base-collector grade layer 16 and the collector 14, FIG. 3B only shows the base layer 17, the $In_{0.53}Ga_{0.47}As$ 16" and the collector 14, and the other layers are not shown in FIGS. 1B to 3B.

Referring to FIG. 1A, a heterojunction bipolar transistor 1 includes a substrate 11, a sub-collector layer 12, a collector layer 14, a base-collector grade layer 16, a base layer 17, and an emitter layer 19. In addition, the heterojunction bipolar transistor 1 of this embodiment can further include a buffer layer 10, an etch stop layer 13, a doped buffer layer 15, a transition layer (set back layer) 18, an emitter cap layer 20, an emitter contact layer E, a base contact layer B, and a collector contact layer C.

The substrate 11 can be an insulation substrate, and the sub-collector layer 12 is disposed on the substrate 11. In this embodiment, the buffer layer 10, which has a thickness of about 10 nm, is configured between the substrate 11 and the sub-collector layer 12, so that the sub-collector layer 12 is disposed above the substrate 11 via the buffer layer 10. In one embodiment, the material of the sub-collector layer 12 or the buffer layer 10 can include, for example, InP, and the sub-collector layer 12 or the buffer layer 10 can be an n-type doped layer.

The etch stop layer 13 is disposed between the sub-collector layer 12 and the collector layer 14. The etch stop layer 13 is configured to prevent the etching of the sub-collector layer 12 during the etching process, thereby controlling the thickness of the sub-collector layer 12. In one embodiment, the material of the etch stop layer 13 can include, for example, InGaAs, and the etch stop layer 13 can be an n-type doped layer.

The collector layer 14 is disposed over the sub-collector layer 12. Since the etch stop layer 13 is provided to control the thickness of the sub-collector layer 12, the collector layer 14 can be disposed over the sub-collector layer 12 via the etch stop layer 13. In addition, the collector layer 14 can be electrically connected to the sub-collector layer 12 via the etch stop layer 13. In one embodiment, the material of the collector layer 14 can include, for example, InP, and the collector layer 14 can be an n-type doped layer.

The doped buffer layer 15 is disposed between the collector layer 14 and the base-collector grade layer 16. In this embodiment, the doped buffer layer 15 can be a delta doped layer, which is configured to buffer the bandgap change between the collector layer 14 and the base-collector grade layer 16. In one embodiment, the material of the doped buffer layer 15 can include, for example, InP, and the doped buffer layer 15 can be an n-type doped layer. In another embodiment, the base-collector grade layer 16 can be directly disposed on the collector layer 14 without configuring the doped buffer layer 15 therebetween.

The base layer 17 is disposed over the collector layer 14, and the base-collector grade layer 16 is disposed between the base layer 17 and the collector layer 14. In this embodiment, the base layer 17 is disposed over the collector layer 14 via the base-collector grade layer 16 and the doped buffer layer 15. In one embodiment, the material of the base layer 17 can include, for example, InGaAs, and the base layer 17 can be a p-type doped layer.

The transition layer 18 (or the set back layer) is disposed between the base layer 17 and the emitter layer 19. In one embodiment, the material of the transition layer 18 can include, for example, non-doped InGaAs (i-InGaAs). In another embodiment, the emitter layer 19 can be directly disposed on the base layer 17 without configuring the transition layer 18 therebetween.

The emitter layer 19 is disposed over the base layer 17. In this embodiment, the emitter layer 19 is disposed over the base layer 17 via the transition layer 18. In one embodiment, the material of the emitter layer 19 can include, for example, InP, and the emitter layer 19 can be an n-type doped layer.

The emitter cap layer 20 is disposed on the emitter layer 19. In one embodiment, the emitter cap layer 20 has a thicker thickness (e.g. 120 nm) for decreasing the contact resistance and improving the conductivity of the emitter contact layer E and the emitter layer 19.

The emitter contact layer E is disposed on the emitter cap layer 20. In this embodiment, the emitter contact layer E contacts the emitter cap layer 20, and the emitter contact layer E is electrically connected to the emitter layer 19 via the emitter cap layer 20. In addition, the base contact layer B is disposed on the base layer 17 and is located next to the emitter layer 19 and the transition layer 18. In this embodiment, the base contact layer B contacts the base layer 17 and is electrically connected to the base layer 17. In addition, the collector contact layer C is located next to the collector layer 14 and is disposed on the etching stop layer 13. In this embodiment, the collector contact layer C contacts the etching stop layer 13 and is electrically connected to the sub-collector layer 12 and the collector layer 14 via the etching stop layer 13. In one embodiment, the material of the emitter contact layer E, the base contact layer B and the collector contact layer C is a metal conductor, such as aluminum, copper, silver, molybdenum, titanium, or any alloys thereof.

Referring to FIG. 1B, the base-collector grade layer 16 is disposed between the base layer 17 and the collector layer 14, and the base-collector grade layer 16 includes at least two stacked periodic structures P. Each of the periodic structures P includes an $In_{0.53}Ga_{0.47}As$ layer 161 and an $Al_xGa_yIn_{1-x-y}As$ layer 162 stacked on the $In_{0.53}Ga_{0.47}As$ layer 161, wherein x ranges from 0.04 to 0.44 ($0.04 \le x \le 0.44$), y ranges from 0.44 to 0.04 ($0.04 \le y \le 0.44$), and the thickness of the $Al_xGa_yIn_{1-x-y}As$ layer 162 ranges from 0.6 nm to 1.8 nm (0.6 nm≤the thickness of layer 162≤1.8 nm).

The base-collector grade layer 16 can be called a super-lattice layer or a quaternary material layer, which includes a plurality of stacked periodic structures P. In these periodic structures P, the materials of the $Al_xGa_yIn_{1-x-y}As$ layers 162 are all the same, but the compositions (x,y) can be the same or different. In addition, all the $In_{0.53}Ga_{0.47}As$ layers 161 are made of the same material, but the thicknesses of the $In_{0.53}Ga_{0.47}As$ layers 161 are different. For example, the thickness of one of the $In_{0.53}Ga_{0.47}As$ layers 161 close to the base layer 17 is greater than the thickness of another one of the $In_{0.53}Ga_{0.47}As$ layers 161 close to the collector layer 14. In some embodiments, the number of periodic structures P of the base-collector grade layer 16 may be 2 to 10 (including 2 and 10). In some embodiments, x+y=0.48.

In this embodiment, the base-collector grade layer 16 as shown in FIG. 1B is called as a structure A.

Specifically, as shown in FIG. 1B, the base-collector grade layer 16 of this embodiment includes six stacked periodic structures P. The thickness of each of the $Al_xGa_yIn_{1-x-y}As$ layers 162 is 0.6 nm. In the $Al_xGa_yIn_{1-x-y}As$ layers 162, the values of (x,y), from top to bottom of layer 16, are: (0.1, 0.38), (0.16, 0.32), (0.22, 0.26), (0.28, 0.2), (0.34, 0.14), and (0.4, 0.08). In addition, the thicknesses of the $In_{0.53}Ga_{0.47}As$ layers 161 gradually increase in the direction from the collector layer 14 to the base layer 17. The thicknesses of the $In_{0.53}Ga_{0.47}As$ layers 161, from top (close to the base layer 17) to bottom (close to the collector layer 14) of the layer 16, are: 2.6 nm, 2.1 nm, 1.7 nm, 1.3 nm, 0.9 nm, and 0.6 nm, respectively. Therefore, the total thickness of the base-collector grade layer 16 of this embodiment is 12.8 nm.

Figure 2A:
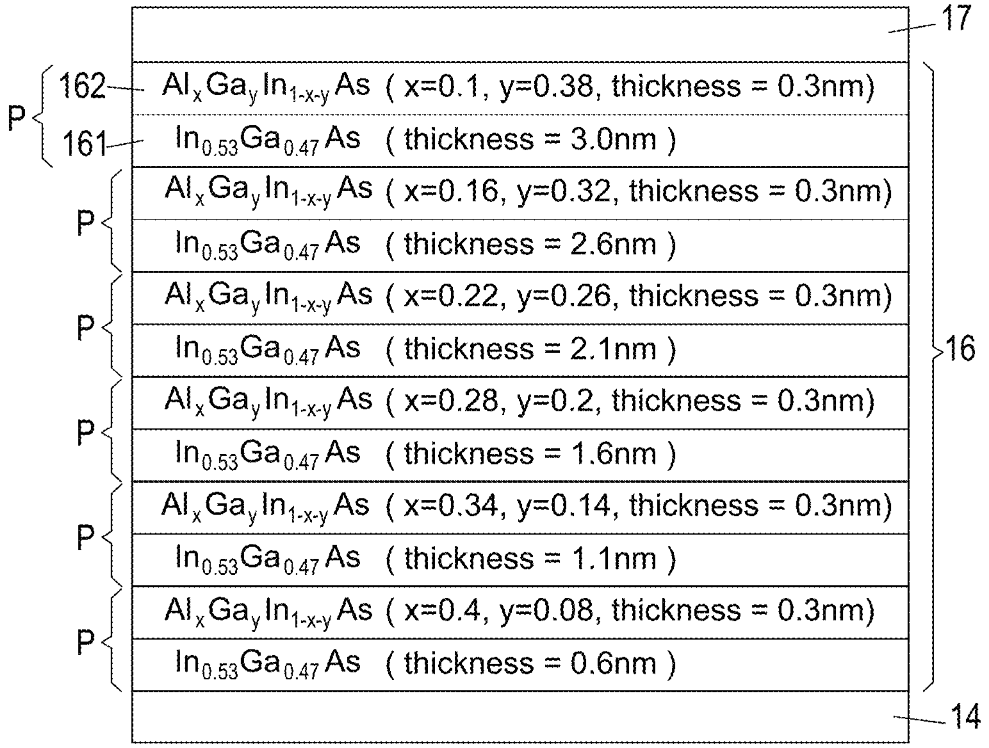
FIGS. 2A to 2F are schematic diagrams showing the base layers, the base-collector grade layers and the collector layers in the heterojunction bipolar transistors according to different embodiments of this disclosure.
Figure 3A:
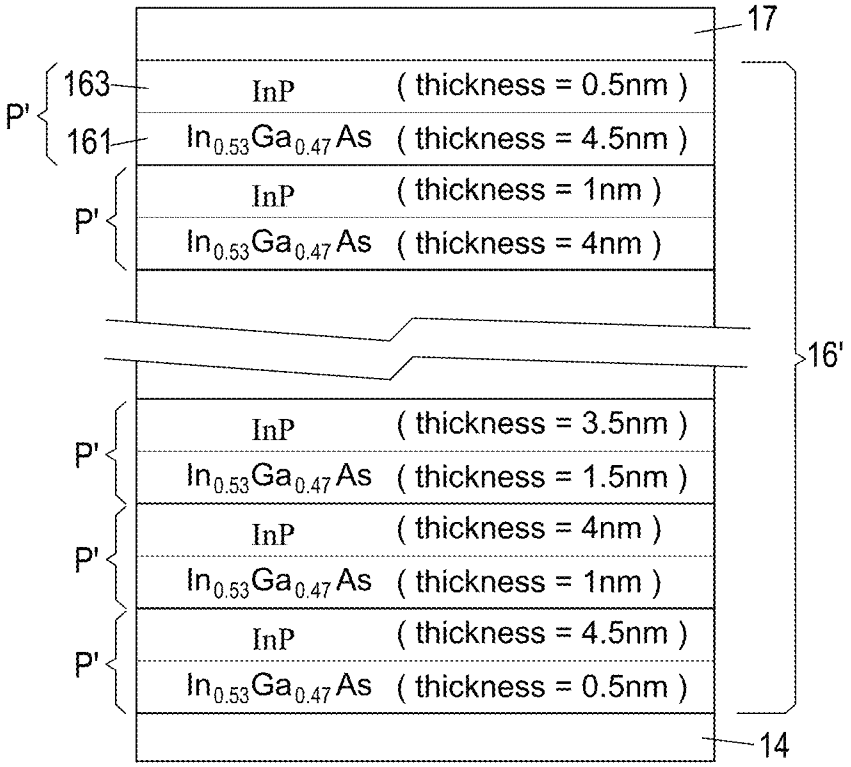
FIGS. 3A and 3B are schematic diagrams showing the structures of comparison examples I and II.
Figure 3B:
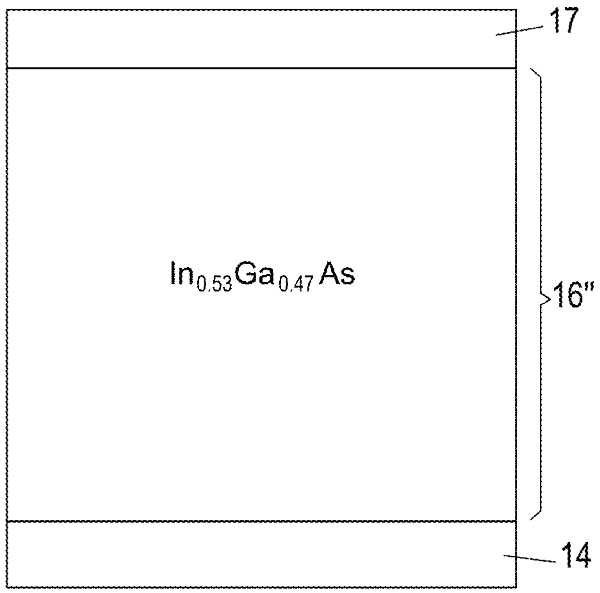

As shown in FIG. 2A, the base-collector grade layer 16 is called as a structure B. The structure B of FIG. 2A is mostly the same as the structure A of FIG. 1B. Unlike the structure A of FIG. 1B, the thicknesses of the $Al_xGa_yIn_{1-x-y}As$ layers 162 in the structure B are all equal to 0.3 nm, and the thicknesses of the $In_{0.53}Ga_{0.47}As$ layers 161, from top to bottom of the layer 16, are: 3.0 nm, 2.6 nm, 2.1 nm, 1.6 nm, 1.1 nm, and 0.6 nm, respectively. The other conditions of the structure B are the same as those of the structure A of FIG. 1B.

Figure 2B:
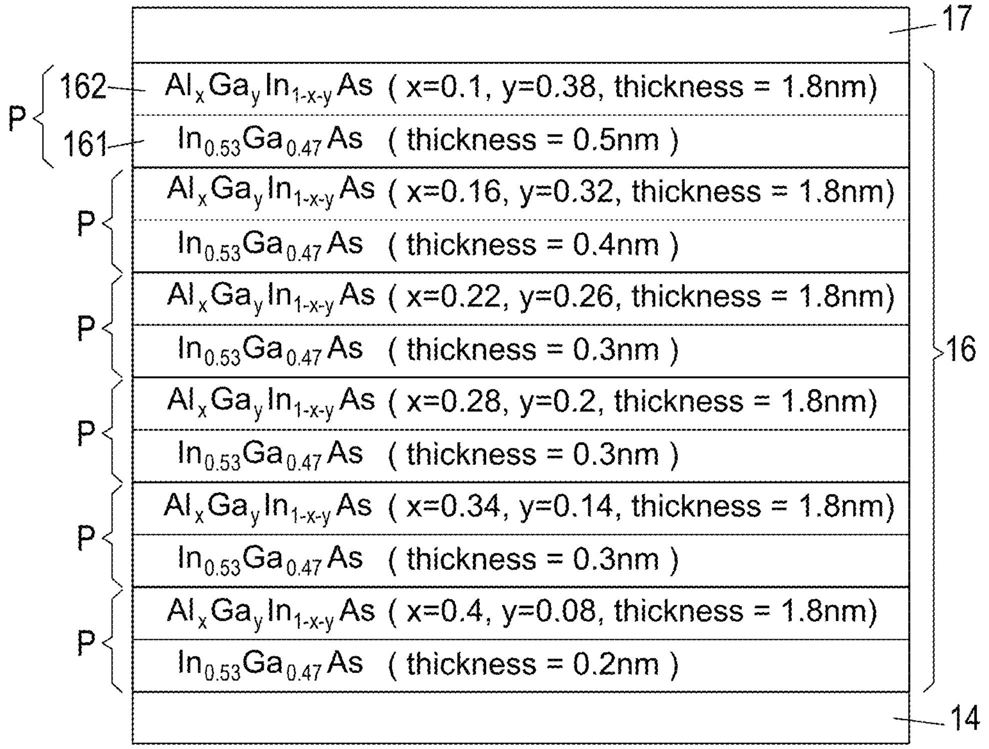

As shown in FIG. 2B, the base-collector grade layer 16 is called as a structure C. The structure C of FIG. 2B is mostly the same as the structure A of FIG. 1B. Unlike the structure A of FIG. 1B, the thicknesses of the $Al_xGa_yIn_{1-x-y}As$ layers 162 in the structure C are all equal to 1.8 nm. In addition, the thicknesses of three $In_{0.53}Ga_{0.47}As$ layers 161 are equal. Specifically, the thicknesses of the $In_{0.53}Ga_{0.47}As$ layers 161, from top to bottom of the layer 16, are: 0.5 nm, 0.4 nm, 0.3 nm, 0.3 nm, 0.3 nm, and 0.2 nm, respectively. The other conditions of the structure C are the same as those of the structure A of FIG. 1B.

Figure 2C:
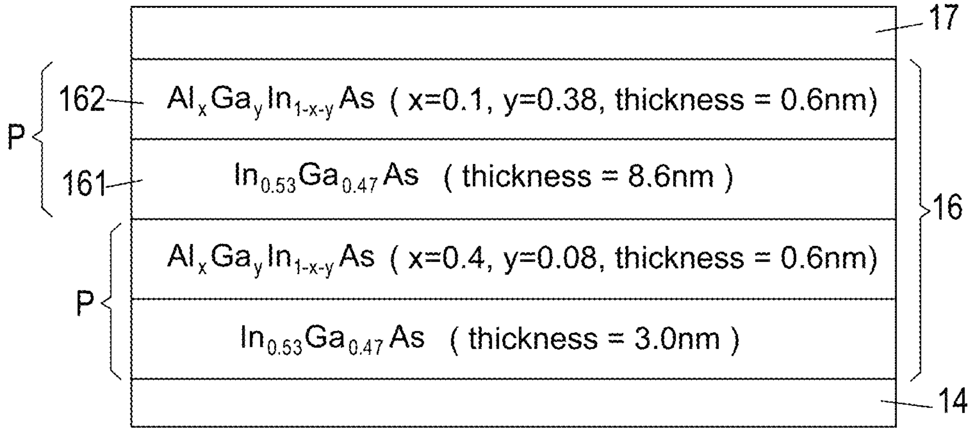

As shown in FIG. 2C, the base-collector grade layer 16 is called as a structure D. The structure D of FIG. 2C is mostly the same as the structure A of FIG. 1B. Unlike the structure A of FIG. 1B, the base-collector grade layer 16 of the structure D includes two stacked periodic structures P, wherein the values of (x,y) of the $Al_xGa_yIn_{1-x-y}As$ layers 162, from top to bottom of layer 16, are: (0.1, 0.38) and (0.4, 0.08). In addition, the thicknesses of the $In_{0.53}Ga_{0.47}As$ layers 161, from top to bottom of the layer 16, are: 8.6 nm and 3.0 nm, respectively. The other conditions of the structure D are the same as those of the structure A of FIG. 1B.

Figure 2D:
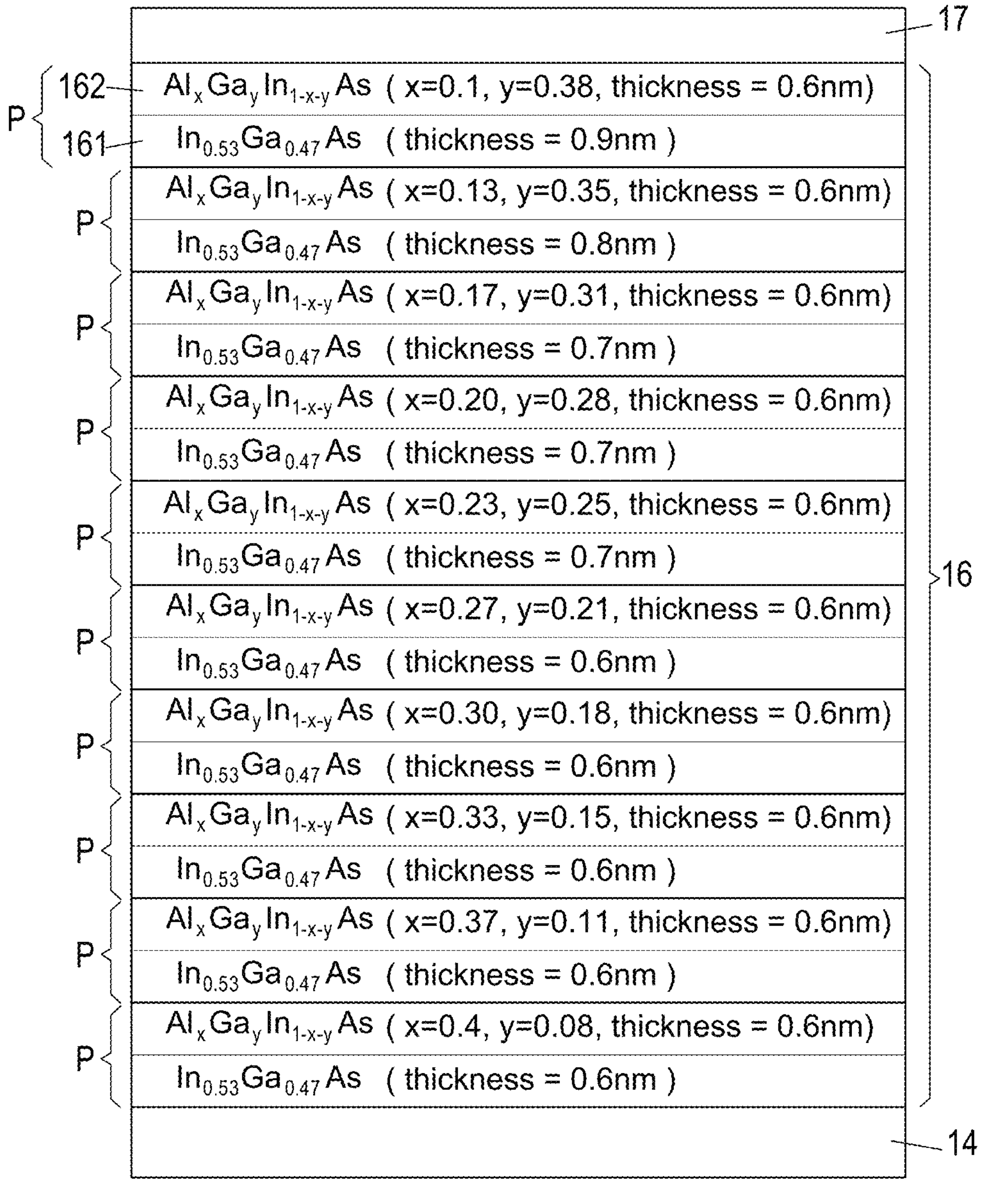

As shown in FIG. 2D, the base-collector grade layer 16 is called as a structure E. The structure E of FIG. 2D is mostly the same as the structure A of FIG. 1B. Unlike the structure A of FIG. 1B, the base-collector grade layer 16 of the structure E includes ten stacked periodic structures P. In this case, the values of (x,y) of the $Al_xGa_yIn_{1-x-y}As$ layers 162, from top to bottom of layer 16, are: (0.1, 0.38), (0.13, 0.35), (0.17, 0.31), (0.20, 0.28), (0.23, 0.25), (0.27, 0.21), (0.30, 0.18), (0.33, 0.15), (0.37, 0.11), and (0.40, 0.08). In addition, the thicknesses of the $In_{0.53}Ga_{0.47}As$ layers 161 of three periodic structures P are equal to 0.7 nm, and the thicknesses of the $In_{0.53}Ga_{0.47}As$ layers 161 of five periodic structures P are equal to 0.6 nm. Specifically, the thicknesses of the $In_{0.53}Ga_{0.47}As$ layers 161, from top to bottom of the layer 16, are: 0.9 nm, 0.8 nm, 0.7 nm, 0.7 nm, 0.7 nm, 0.6 nm, 0.6 nm, 0.6 nm, 0.6 nm and 0.6 nm, respectively. The other conditions of the structure E are the same as those of the structure A of FIG. 1B.

Figure 2E:
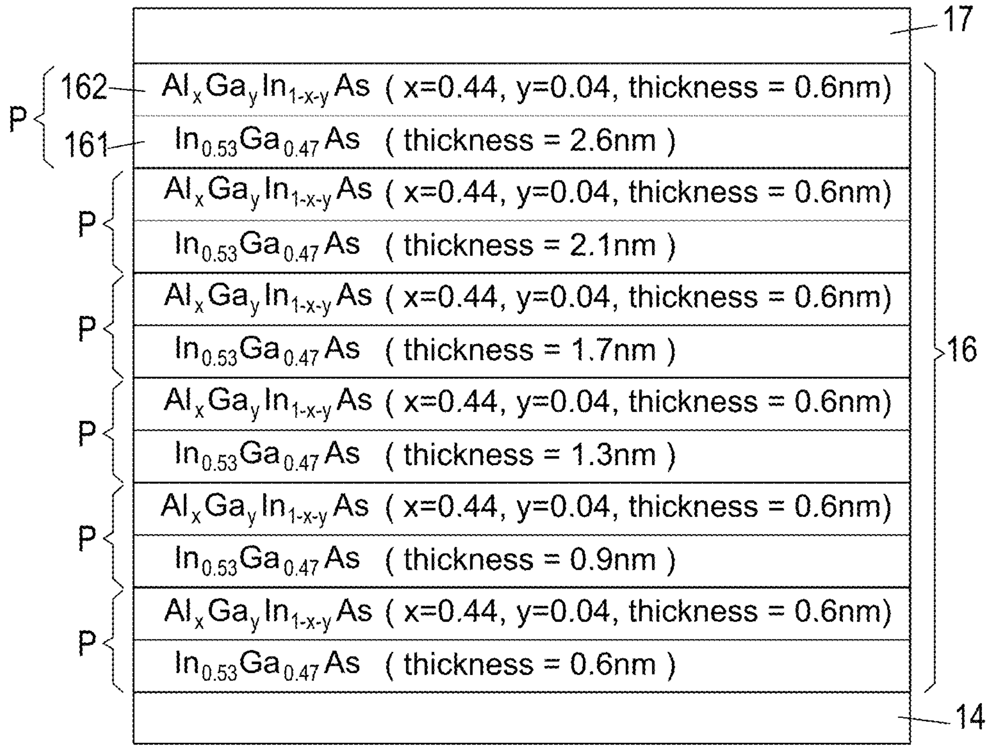

As shown in FIG. 2E, the base-collector grade layer 16 is called as a structure F. The structure F of FIG. 2E is mostly the same as the structure A of FIG. 1B. Unlike the structure A of FIG. 1B, the values of (x,y) of the $Al_xGa_yIn_{1-x-y}As$ layers 162 in the base-collector grade layer 16 of the structure F are all equal to (0.44, 0.04), wherein x+y=0.48. The other conditions of the structure F are the same as those of the structure A of FIG. 1B.

Figure 2F:
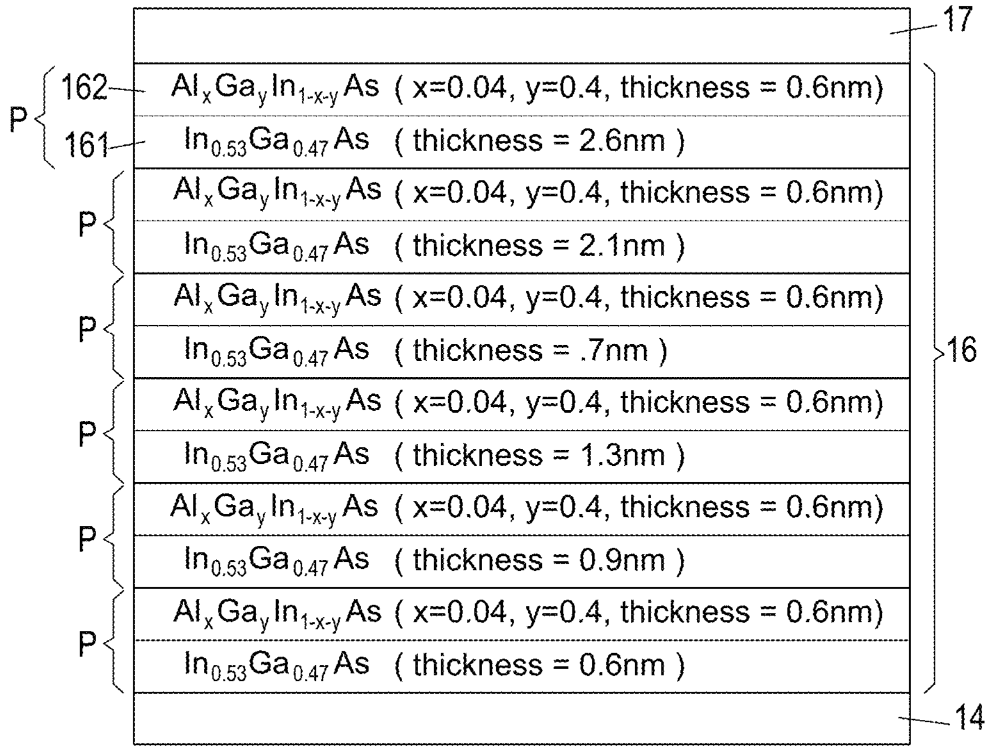

As shown in FIG. 2F, the base-collector grade layer 16 is called as a structure G. The structure G of FIG. 2F is mostly the same as the structure A of FIG. 1B. Unlike the structure A of FIG. 1B, the values of (x,y) of the $Al_xGa_yIn_{1-x-y}As$ layers 162 in the base-collector grade layer 16 of the structure G are all equal to (0.04, 0.44), wherein x+y=0.48. The other conditions of the structure G are the same as those of the structure A of FIG. 1B.

As shown in FIG. 3A, the comparative example I shows a conventional superlattice base-collector grade layer 16', which has ten stacked periodic structures P' Each periodic structure P' includes an $In_{0.53}Ga_{0.47}As$ layer 161 and an InP layer 163 stacked on the $In_{0.53}Ga_{0.47}As$ layer 161. The total thickness of the base-collector gradient layer 16' of the comparative example I is 50 nm.

In the comparative example II as shown in FIG. 3B, a $In_{0.53}Ga_{0.47}As$ layer 16" is disposed between a base layer 17 and a collector layer 14, and the total thickness thereof is equal to that of the structure A (i.e., 12.8 nm).

With reference to the following drawings, the comparisons of the characteristic simulation results of the example I, the example II and some embodiments of the present disclosure are shown. These comparisons can prove that the structure A to structure G of the above-mentioned embodiments can indeed eliminate the discontinuity of conduction band between the base layer and collector layer, reduce the electron blocking effect, and increase the cutoff frequency. Moreover, the base-collector grade layer of each of the structure A to structure G of the above-mentioned embodiments has a smaller thickness.

Figure 4:
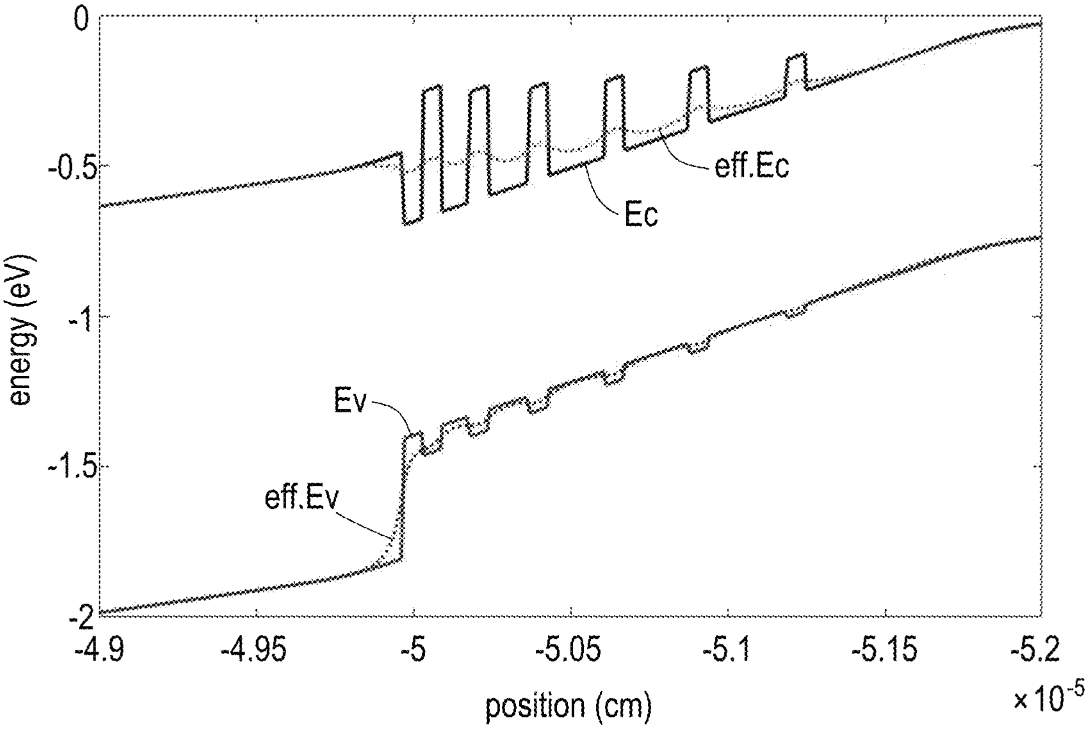
FIG. 4 is a schematic diagram showing the effective bandgap of the heterojunction bipolar transistor according to the embodiment of this disclosure.

FIG. 4 is a schematic diagram showing the effective bandgap of the heterojunction bipolar transistor according to the embodiment of this disclosure. In this embodiment, the heterojunction bipolar transistor of FIG. 4 at least includes the above-mentioned structure A. As shown in FIG. 4, $E_c$ represents the quantum potential of electrons, $E_v$ represents the quantum potential of holes, eff. $E_c$ represents the effective $E_c$, eff. $E_v$ represents the effective $E_v$, and the effective bandgap is the difference of eff. $E_c$ and eff. $E_v$ as shown in FIG. 4, which can refer to the following equation:

$$E_{g,eff} = E_{c,eff} - E_{v,eff}.$$

Referring to FIG. 4, the eff. $E_c$ and eff. $E_v$ of the heterojunction bipolar transistor 1, which includes the structure A, can both be presented by smooth curves, and the $E_{g,eff}$, which can be obtained by the difference of the above two curves, is also a smooth curve. Therefore, the heterojunction bipolar transistor 1 including the structure A can reduce the electron-blocking effect.

Figure 5A:
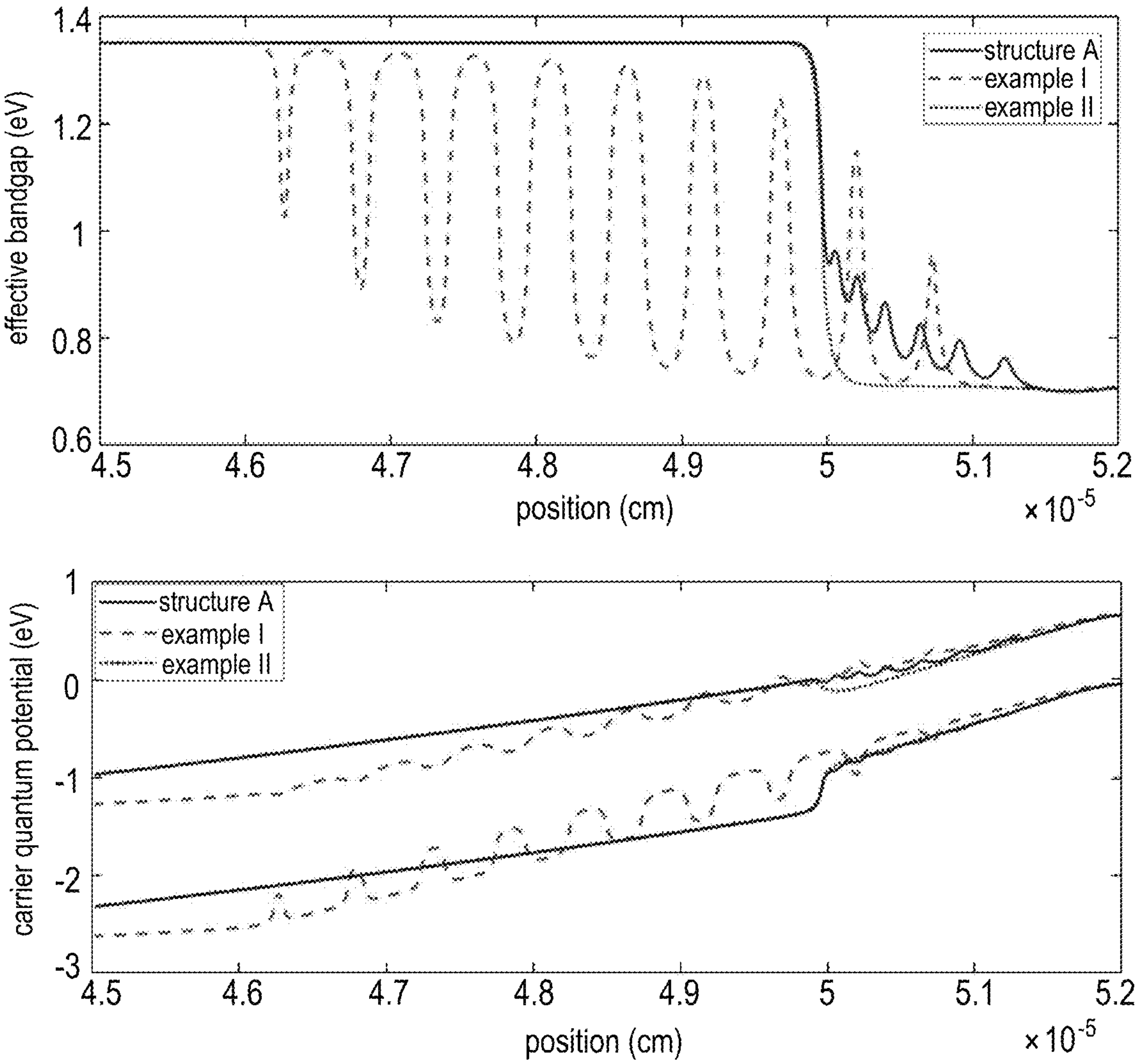
FIG. 5A is a schematic diagram showing the effective bandgaps of the comparison examples I and II and the embodiment of this disclosure.

FIG. 5A is a schematic diagram showing the effective bandgaps of the comparison examples I and II and the embodiment of this disclosure. As shown in FIG. 5A, although the effective bandgap of example I is larger than that of structure A, the curve of eff. $E_c$ of example I has drastically changes, thus forming a higher electronic barrier. Therefore, the capacitance of example I is relatively larger than that of structure A. In addition, the effective bandgap of structure A is higher than that of example II, so the device's breakdown voltage (BVcbo) of structure A is also higher.

Figure 5B:
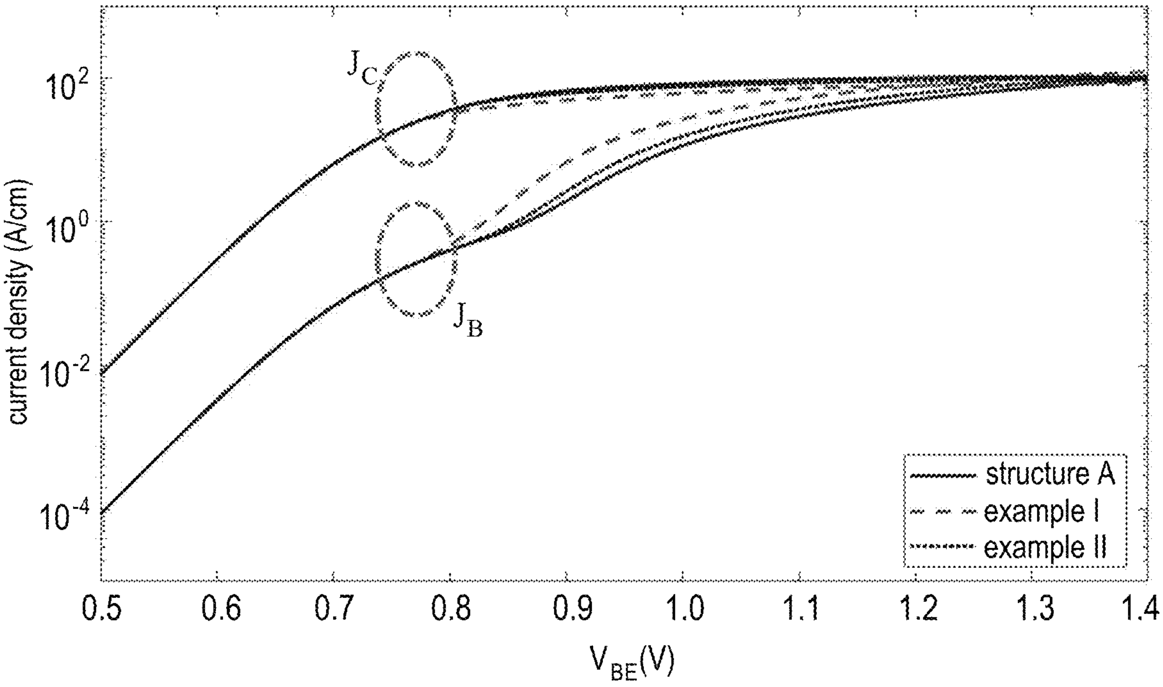
FIG. 5B is a schematic diagram showing the current densities of the comparison examples I and II and the embodiment of this disclosure.

FIG. 5B is a schematic diagram showing the current densities of the comparison examples I and II and the embodiment of this disclosure. Herein, $J_C$ represents the collector current density, and $J_B$ represents the base current density. As shown in FIG. 5B, the structure of Example I adopts the chirp-superlattice structure to increase the breakdown voltage (BVcbo). However, since the curve of eff. $E_c$ of example I has drastically changes (see FIG. 4), which increases the electron blocking effect, the collector current ($J_C$) of structure A can be slightly higher than that of example I.

Figure 5C:
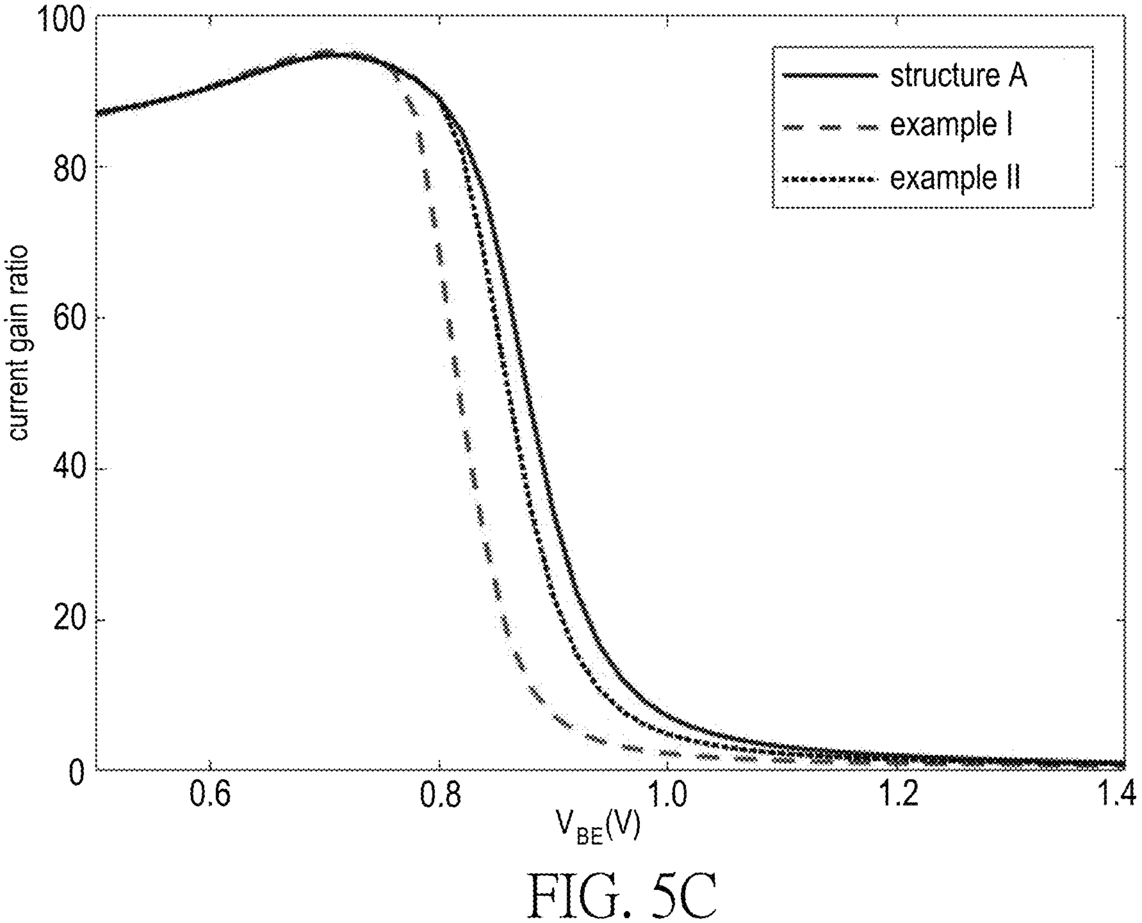
FIG. 5C is a schematic diagram showing the DC current gains of the comparison examples I and II and the embodiment of this disclosure.

FIG. 5C is a schematic diagram showing the DC current gains of the comparison examples I and II and the embodiment of this disclosure. The DC current gain (β) can be calculated as the ratio of collector current to base current. As shown in FIG. 5C, compared with the example I (having a thickness of 50 nm), since the structure A has a smaller thickness (12.8 nm), it can have a larger collector current ($J_C$). Therefore, the structure A can have a higher DC current gain (β).

Figure 5D:
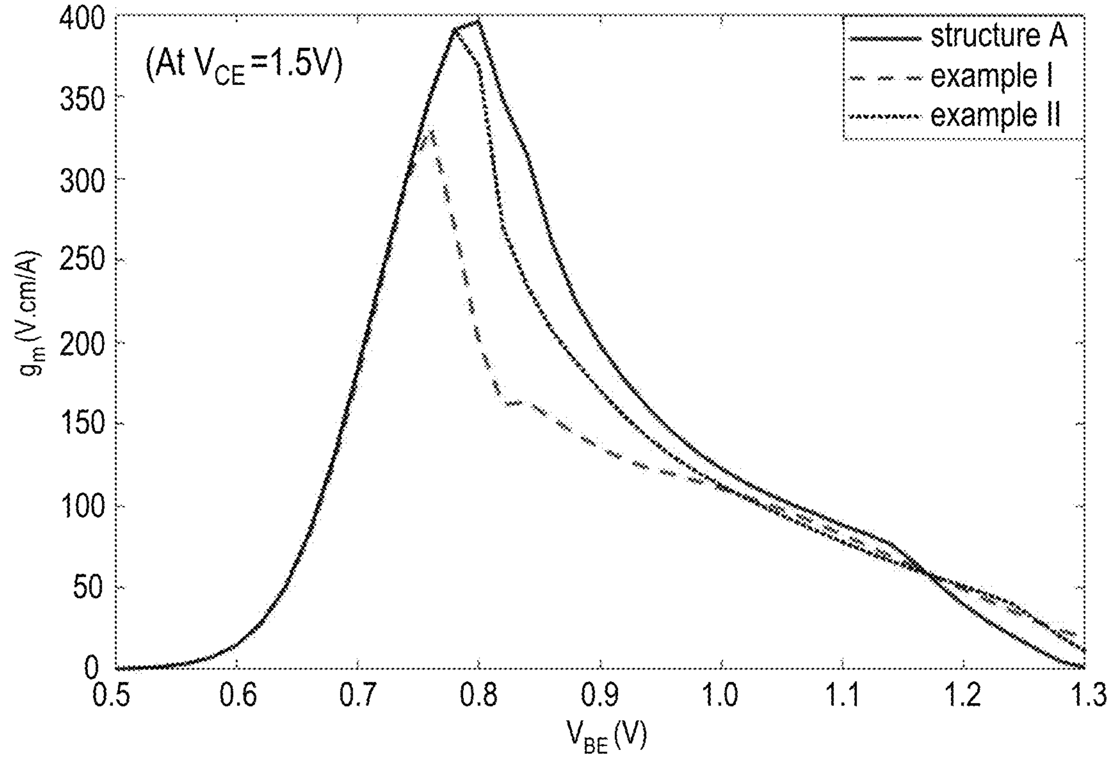
FIG. 5D is a schematic diagram showing the AC transconductances of device of the comparison examples I and II and the embodiment of this disclosure.

FIG. 5D is a schematic diagram showing the AC transconductances of device of the comparison examples I and II and the embodiment of this disclosure. In this case, the peak of cutoff frequency ($f_T$) is 0.7 V. As shown in FIG. 5D, compared with the examples I and II, the structure A has a higher AC transconductance ($g_m$).

Figure 5E:
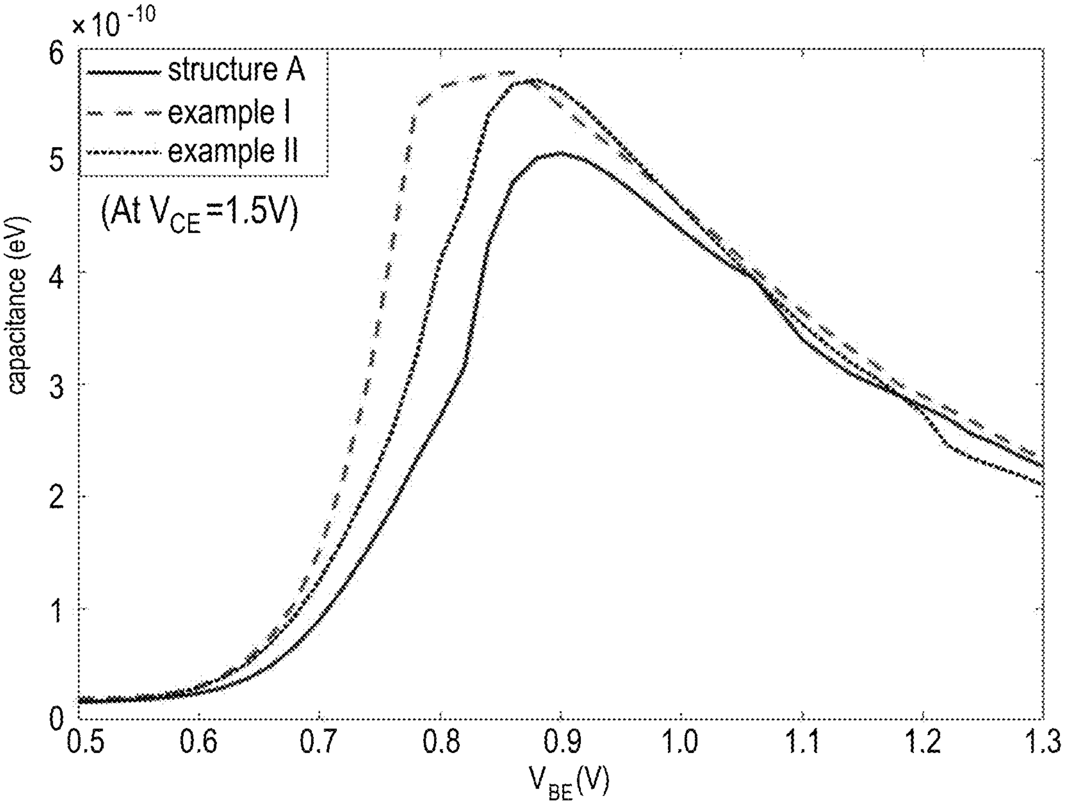
FIG. 5E is a schematic diagram showing the capacitances of device of the comparison examples I and II and the embodiment of this disclosure.

FIG. 5E is a schematic diagram showing the capacitances of device of the comparison examples I and II and the embodiment of this disclosure. In this case, the peak of cutoff frequency ($f_T$) is 0.7 V. As shown in FIG. 5E, compared with the examples I and II, the structure A has a lower capacitance value.

Figure 5F:
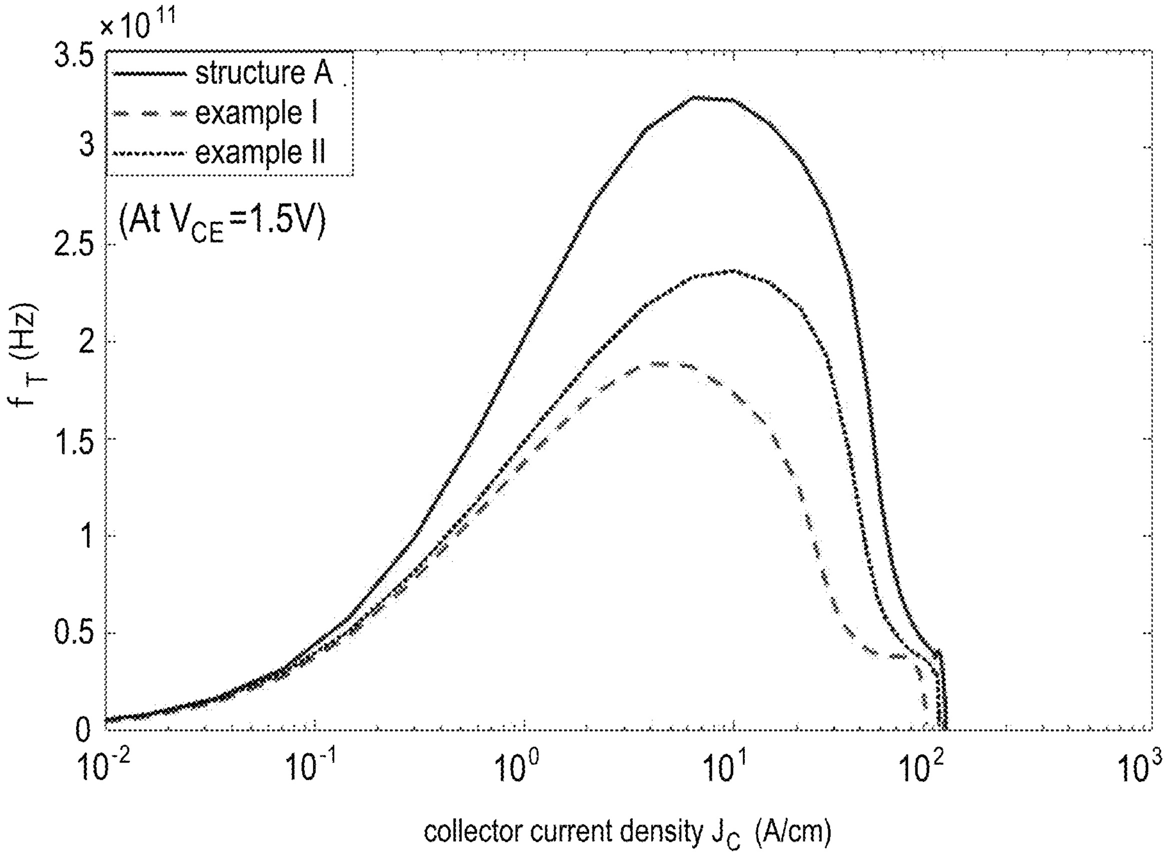
FIG. 5F is a schematic diagram showing the cutoff frequency vs. collector current density of the comparison examples I and II and the embodiment of this disclosure.

FIG. 5F is a schematic diagram showing the cutoff frequency vs. collector current density of the comparison examples I and II and the embodiment of this disclosure. In this case, the formula of cutoff frequency ($f_T$) is as following:

$$f_T = g_m / 2\pi C$$

Herein, $g_m$ represents the AC transconductance, and C represents capacitance. It can be seen from the aforementioned FIG. 5D and FIG. 5E that the structure A has higher AC transconductance ($g_m$) and lower capacitance (C). Therefore, as shown in FIG. 5F, compared with examples I and II, the structure A has a higher cutoff frequency ($f_T$).

Figure 5G:
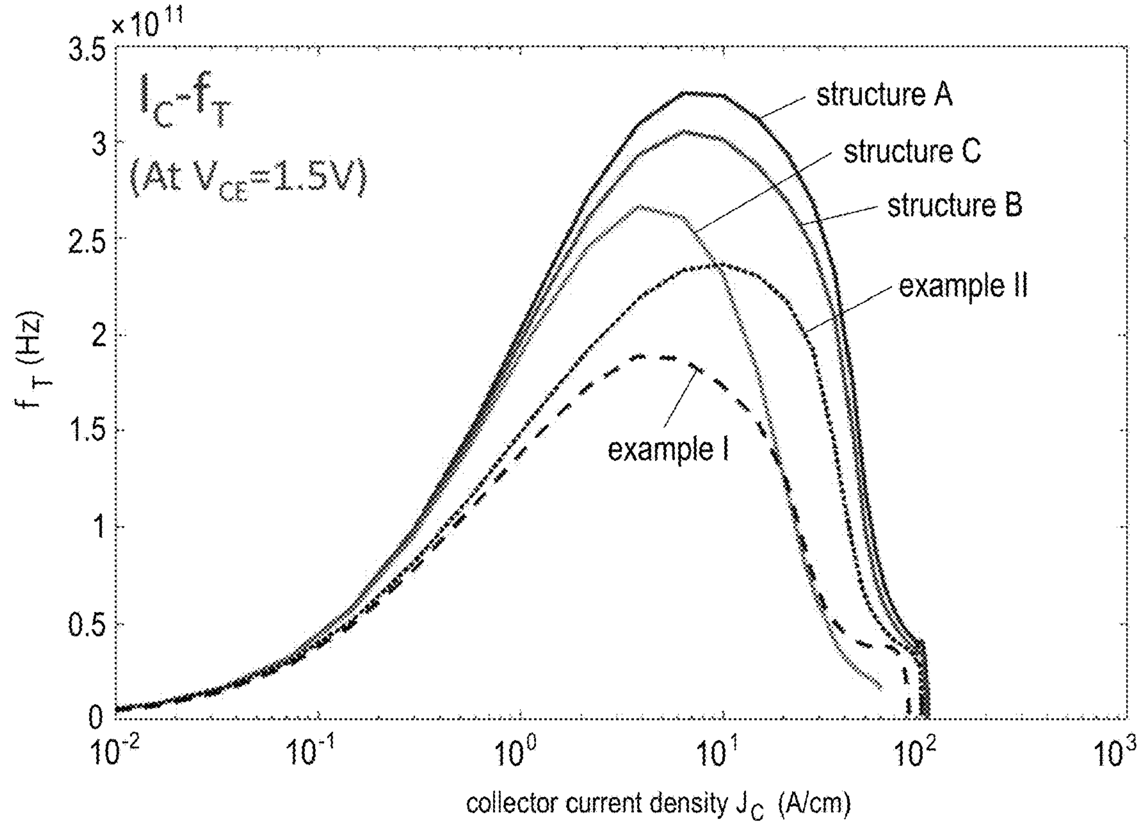
FIG. 5G is a schematic diagram showing the cutoff frequency vs. collector current density of the comparison examples I and II and three embodiments of this disclosure.

FIG. 5G is a schematic diagram showing the cutoff frequency vs. collector current density of the comparison examples I and II and three embodiments of this disclosure. As shown in FIG. 5G, in addition to the structure A, even though the $Al_xGa_yIn_{1-x-y}As$ layers 162 of structures B and C have different thicknesses, the cutoff frequencies ($f_T$) of structures B and C are still higher than those of examples I and II.

Figure 5H:
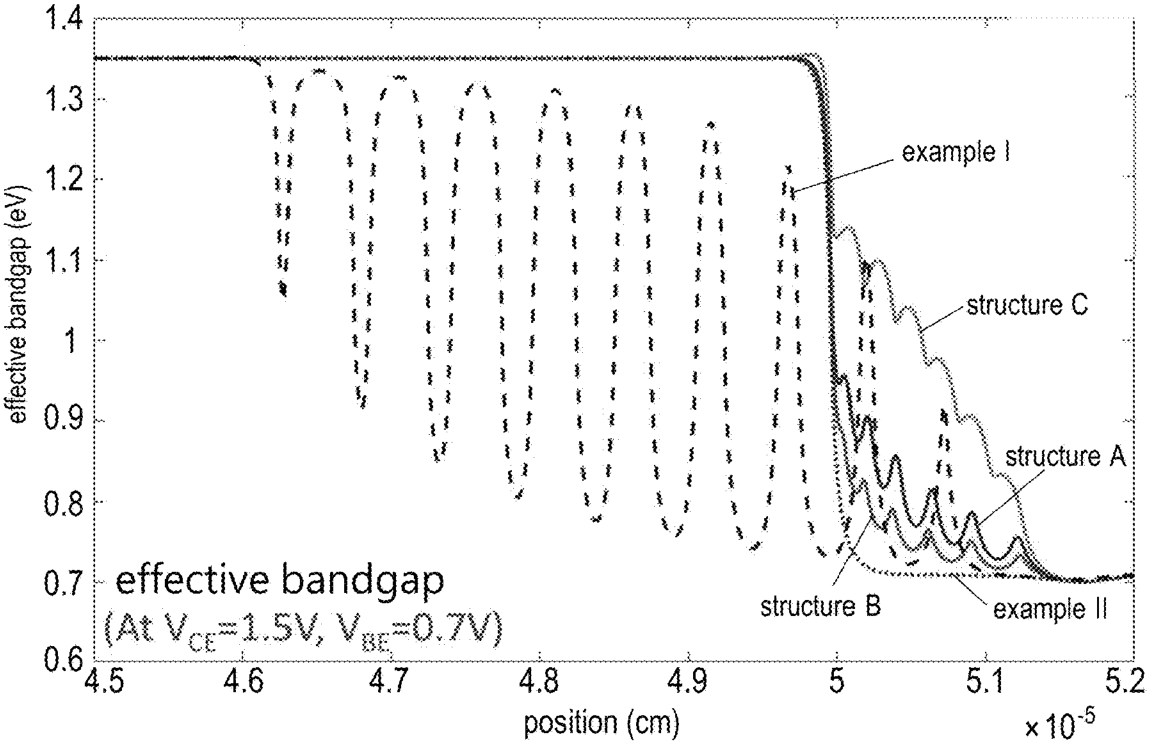
FIG. 5H is a schematic diagram showing the effective bandgaps of the comparison examples I and II and three embodiments of this disclosure.

FIG. 5H is a schematic diagram showing the effective bandgaps of the comparison examples I and II and three embodiments of this disclosure. As shown in FIG. 5H, in addition to the structure A, even though the $Al_xGa_yIn_{1-x-y}As$ layers 162 of structures B and C have different thicknesses, the effective bandgaps of structures B and C are still higher than those of examples I and II.

Figure 5I:
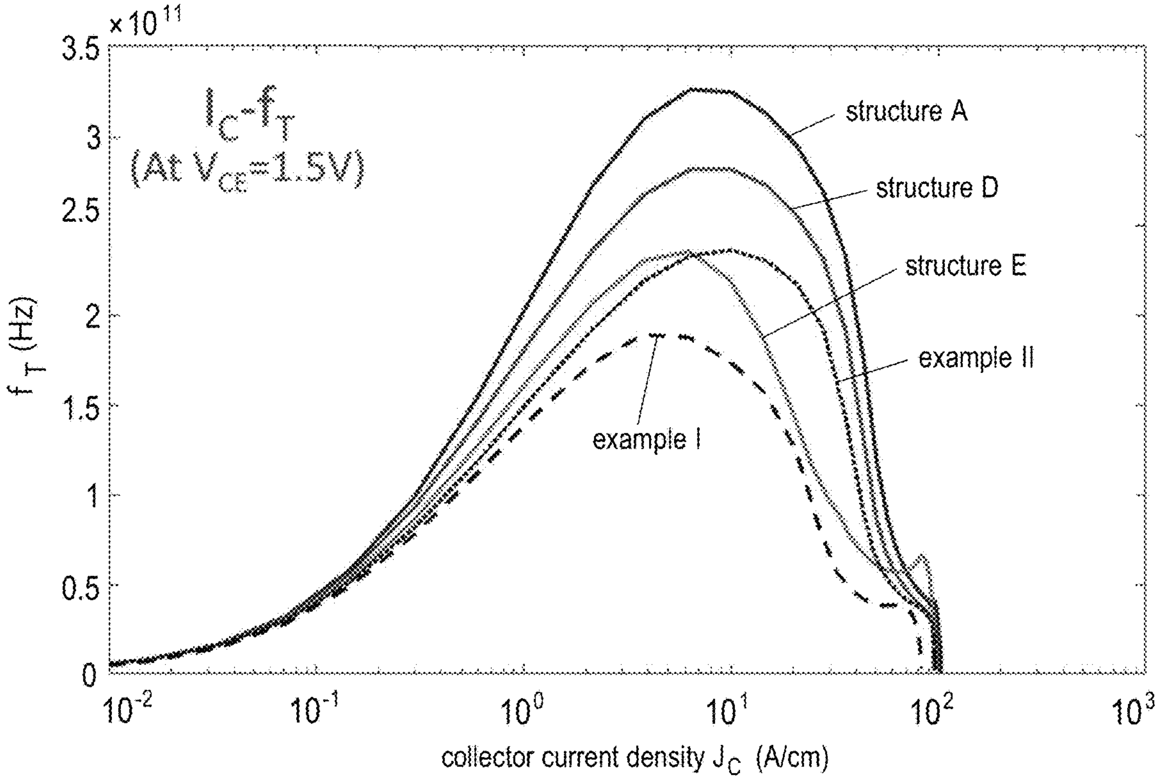
FIG. 5I is another schematic diagram showing the cutoff frequency vs. collector current density of the comparison examples I and II and three embodiments of this disclosure.

FIG. 5I is another schematic diagram showing the cutoff frequency vs. collector current density of the comparison examples I and II and three embodiments of this disclosure. As shown in FIG. 5I, in addition to the structure A, even though the amounts of periodic structures P in structures D and E are different (the structure D includes 2 periodic structures P, and the structure E includes 10 periodic structures P), the cutoff frequencies ($f_T$) of structures D and E are still higher than those of examples I and II.

Figure 5J:
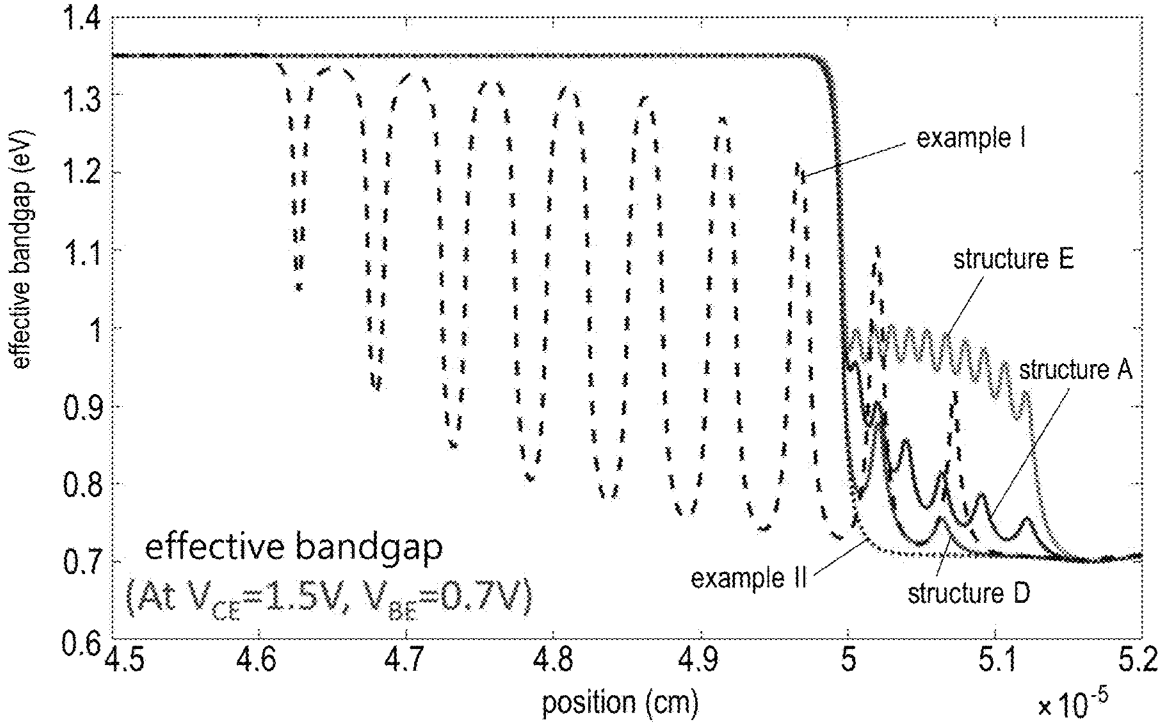
FIG. 5J is another schematic diagram showing the effective bandgaps of the comparison examples I and II and three embodiments of this disclosure.

FIG. 5J is another schematic diagram showing the effective bandgaps of the comparison examples I and II and three embodiments of this disclosure. As shown in FIG. 5J, in addition to the structure A, even though the amounts of periodic structures P in structures D and E are different (the structure D includes 2 periodic structures P, and the structure E includes 10 periodic structures P), the curves of eff. $E_c$ of structures D and E are smoother, so that they have lower electron barrier. In addition, the effective bandgap of structure E is still higher than that of example II.

Figure 5K:
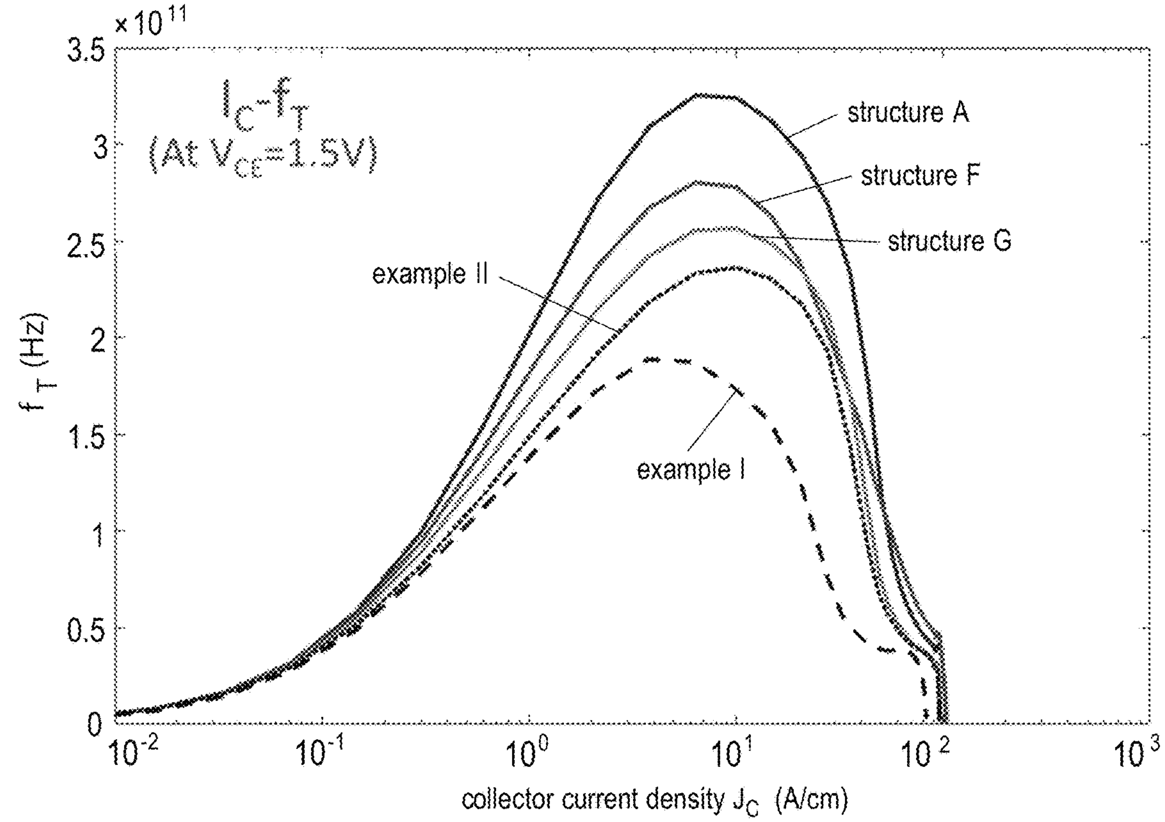
FIG. 5K is another schematic diagram showing the cutoff frequency vs. collector current density of the comparison examples I and II and three embodiments of this disclosure.

FIG. 5K is another schematic diagram showing the cutoff frequency vs. collector current density of the comparison examples I and II and three embodiments of this disclosure. As shown in FIG. 5K, in addition to the structure A, even though the values of x and y of the $Al_xGa_yIn_{1-x-y}As$ layers 162 of structures F and G are different, the cutoff frequencies ($f_T$) of structures F and G are still higher than those of examples I and II.

Figure 5L:
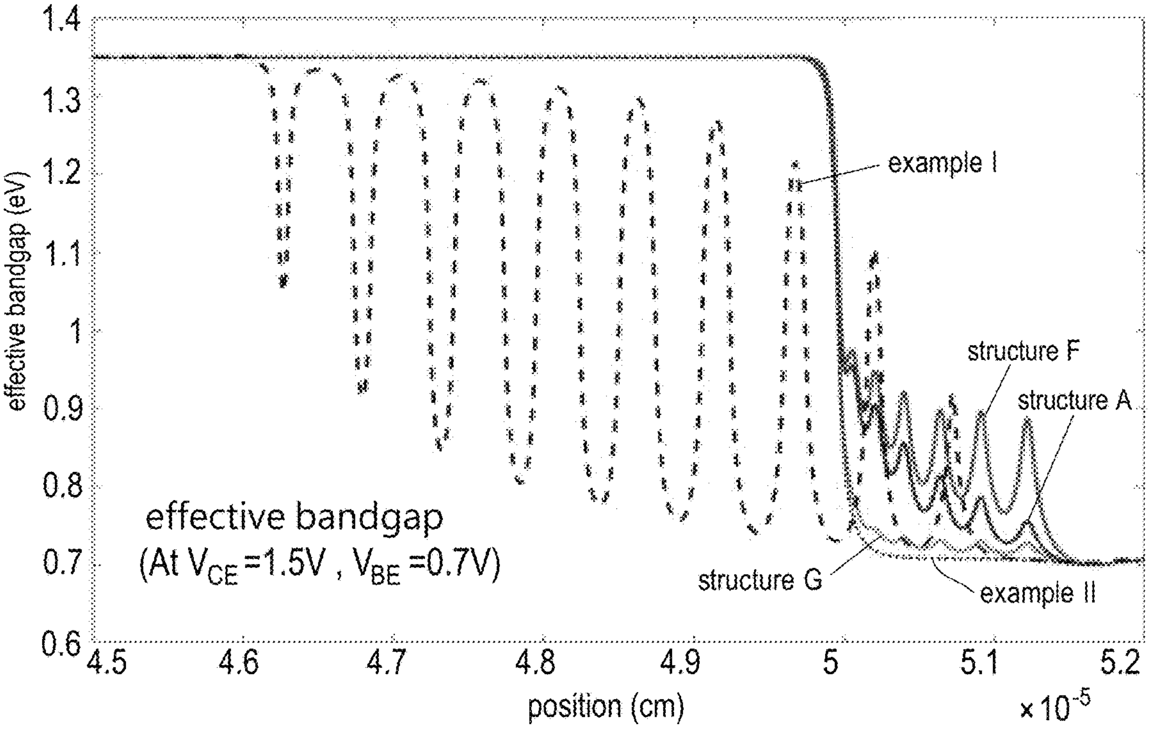
FIG. 5L is another schematic diagram showing the effective bandgaps of the comparison examples I and II and three embodiments of this disclosure.

FIG. 5L is another schematic diagram showing the effective bandgaps of the comparison examples I and II and three embodiments of this disclosure. As shown in FIG. 5L, in addition to the structure A, even though the values of x and y of the $Al_xGa_yIn_{1-x-y}As$ layers 162 of structures F and G are different, the effective bandgaps of structures F and G are still higher than that of example II.

Based on the above comparison results, it can be seen that the heterojunction bipolar transistors of some embodiments of the present disclosure can indeed change the energy band structure by changing the material composition and thickness of the base-collector grade layer, thereby eliminating the discontinuity of conduction band between the base layer and collector layer so as to reduce the electron blocking effect and increase the cut-off frequency ($f_T$). Compared with the conventional solution (e.g. comparative example I), the base-collector gradient layers of some embodiments of the present disclosure has a relatively small thickness. In addition, compared with the comparative examples I and II, some embodiments of the present disclosure can further increase the effective bandgaps of the depletion region and increase the device's breakdown voltage.

In summary, in the base-collector grade layer and heterojunction bipolar transistor of this disclosure, the base-collector grade layer is disposed between the base layer and the collector layer, and includes at least two stacked periodic structures. Each periodic structure includes an $In_{0.53}Ga_{0.47}As$ layer and an $Al_xGa_yIn_{1-x-y}As$ layer stacked on the $In_{0.53}Ga_{0.47}As$ layer, wherein x ranges from 0.04 to 0.44, y ranges from 0.44 to 0.04, and the thickness of the $Al_xGa_yIn_{1-x-y}As$ layer ranges from 0.6 nm to 1.8 nm. Based on this design, the heterojunction bipolar transistor of this disclosure can eliminate the discontinuity of conduction band between the base layer and collector layer, reduce the electron blocking effect, and increase the cutoff frequency. Moreover, compared with the conventional technology, the base-collector grade layer of this disclosure has a smaller thickness, so that the thickness of the entire heterojunction bipolar transistor also has a smaller thickness.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A heterojunction bipolar transistor, comprising:
- a substrate;
- a sub-collector layer disposed on the substrate;
- a collector layer disposed over the sub-collector layer;
- a base layer disposed over the collector layer;
- a base-collector grade layer disposed between the base layer and the collector layer, wherein the base-collector grade layer comprises at least two stacked periodic structures, each of the periodic structures comprises an $In_{0.53}Ga_{0.47}As$ layer and an $Al_xGa_yIn_{1-x-y}As$ layer stacked on the $In_{0.53}Ga_{0.47}As$ layer, x ranges from 0.04 to 0.44, y ranges from 0.44 to 0.04, and a thickness of the $Al_xGa_yIn_{1-x-y}As$ layer ranges from 0.6 nm to 1.8 nm; and
- an emitter layer disposed over the base layer.

2. The heterojunction bipolar transistor of claim 1, further comprising:
- an etch stop layer disposed between the sub-collector layer and the collector layer; and
- a collector contact layer arranged next to the collector layer and disposed on the etch stop layer.

3. The heterojunction bipolar transistor of claim 1, further comprising:
- an emitter cap layer disposed on the emitter layer;
- an emitter contact layer disposed on the emitter cap layer; and
- a base contact layer arranged next to the emitter layer and disposed on the base layer.

4. The heterojunction bipolar transistor of claim 1, further comprising:
- a doped buffer layer disposed between the collector layer and the base-collector grade layer; and
- a transition layer disposed between the base layer and the emitter layer.

5. The heterojunction bipolar transistor of claim 1, wherein the base-collector grade layer comprises 2 to 10 of the stacked periodic structures.

6. The heterojunction bipolar transistor of claim 1, wherein x+y=0.48.

7. The heterojunction bipolar transistor of claim 1, wherein the thicknesses of the $Al_xGa_yIn_{1-x-y}As$ layers in the stacked periodic structures are equal.

8. The heterojunction bipolar transistor of claim 1, wherein a thickness of one of the $In_{0.53}Ga_{0.47}As$ layers close to the base layer is greater than a thickness of another one of the $In_{0.53}Ga_{0.47}As$ layers close to the collector layer.

9. The heterojunction bipolar transistor of claim 1, wherein the base-collector grade layer comprises six of the stacked periodic structures, and thicknesses of the $In_{0.53}Ga_{0.47}As$ layers in the six stacked periodic structures are increasing in a direction from the collector layer to the base layer.

10. The heterojunction bipolar transistor of claim 1, wherein the base-collector grade layer comprises ten of the stacked periodic structures, and thicknesses of some of the $In_{0.53}Ga_{0.47}As$ layers in the ten stacked periodic structures are equal.

11. A base-collector grade layer of a heterojunction bipolar transistor, wherein the heterojunction bipolar transistor comprises a base layer, a collector layer, and the base-collector grade layer disposed between the base layer and the collector layer, the base-collector grade layer comprising:

at least two stacked periodic structures;

wherein, each of the periodic structures comprises an $In_{0.53}Ga_{0.47}As$ layer and an $Al_xGa_yIn_{1-x-y}As$ layer stacked on the $In_{0.53}Ga_{0.47}As$ layer, wherein x ranges from 0.04 to 0.44, y ranges from 0.44 to 0.04, and a thickness of the $Al_xGa_yIn_{1-x-y}As$ layer ranges from 0.6 nm to 1.8 nm.

12. The base-collector grade layer of claim 11, wherein the base-collector grade layer comprises 2 to 10 of the stacked periodic structures.

13. The base-collector grade layer of claim 11, wherein $x+y=0.48$.

14. The base-collector grade layer of claim 11, wherein the thicknesses of the $Al_xGa_yIn_{1-x-y}As$ layers in the stacked periodic structures are equal.

15. The base-collector grade layer of claim 11, wherein a thickness of one of the $In_{0.53}Ga_{0.47}As$ layers close to the base layer is greater than a thickness of another one of the $In_{0.53}Ga_{0.47}As$ layers close to the collector layer.

16. The base-collector grade layer of claim 11, wherein the base-collector grade layer comprises six of the stacked periodic structures, and thicknesses of the $In_{0.53}Ga_{0.47}As$ layers in the six stacked periodic structures are increasing in a direction from the collector layer to the base layer.

17. The base-collector grade layer of claim 11, wherein the base-collector grade layer comprises ten of the stacked periodic structures, and thicknesses of some of the $In_{0.53}Ga_{0.47}As$ layers in the ten stacked periodic structures are equal.

* * * * *